(12) United States Patent
Yamamoto et al.

(10) Patent No.: US 9,136,801 B2
(45) Date of Patent: Sep. 15, 2015

(54) SEMICONDUCTOR INTEGRATED CIRCUIT DEVICE, ELECTRONIC DEVICE, AND RADIO COMMUNICATION DEVICE

(75) Inventors: Seiji Yamamoto, Tokyo (JP); Miki Shiraishi, Tokyo (JP); Yutaka Uneme, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/484,939

(22) Filed: May 31, 2012

(65) Prior Publication Data
US 2012/0309456 A1    Dec. 6, 2012

(30) Foreign Application Priority Data

May 31, 2011    (JP) ................................. 2011-121534

(51) Int. Cl.
| | |
|---|---|
| H04B 1/38 | (2006.01) |
| H03F 3/195 | (2006.01) |
| H04L 25/02 | (2006.01) |
| H03F 3/24 | (2006.01) |
| H03F 3/45 | (2006.01) |
| H03F 3/68 | (2006.01) |
| H03F 3/72 | (2006.01) |

(52) U.S. Cl.
CPC ................. *H03F 3/195* (2013.01); *H03F 3/24* (2013.01); *H03F 3/45475* (2013.01); *H03F 3/68* (2013.01); *H03F 3/72* (2013.01); *H04L 25/0278* (2013.01); *H03F 2200/255* (2013.01); *H03F 2200/411* (2013.01); *H03F 2200/423* (2013.01); *H03F 2200/543* (2013.01); *H03F 2203/45644* (2013.01); *H03F 2203/45686* (2013.01); *H03F 2203/45702* (2013.01); *H03F 2203/45726* (2013.01)

(58) Field of Classification Search
USPC .................. 455/557, 572, 14; 326/30, 82, 83; 710/32
See application file for complete search history.

(56) References Cited

U.S. PATENT DOCUMENTS

| | | | | |
|---|---|---|---|---|
| 6,411,121 | B1 * | 6/2002 | Culler | 710/32 |
| 6,738,603 | B1 * | 5/2004 | Saito | 455/90.1 |
| 8,483,986 | B2 * | 7/2013 | Riho | 702/99 |
| 2001/0000428 | A1 * | 4/2001 | Abadeer et al. | 333/33 |
| 2002/0156960 | A1 | 10/2002 | Koga | |
| 2008/0030242 | A1 * | 2/2008 | Chujo et al. | 327/109 |

(Continued)

FOREIGN PATENT DOCUMENTS

| | | |
|---|---|---|
| JP | 2002-297274 A | 10/2002 |
| JP | 2009-130500 A | 6/2009 |

OTHER PUBLICATIONS

Brooks, Doug, "Termination Placement in PCB Design How Much Does It Matter?", UltraCAD Design, Inc. and Mentor Graphics Corporation, 2002, pp. 1-6.

(Continued)

*Primary Examiner* — Christopher M Brandt
*Assistant Examiner* — Joseph Dean, Jr.
(74) *Attorney, Agent, or Firm* — Miles & Stockbridge P.C.

(57) ABSTRACT

In an embodiment, a semiconductor integrated circuit device includes a driver circuit that drives a transmission line, an output terminal coupled to the output of the driver circuit, and a variable-impedance circuit. The variable-impedance circuit is coupled, for example, between the driver circuit and the output terminals for series-termination of the transmission line.

6 Claims, 13 Drawing Sheets

(56) References Cited

U.S. PATENT DOCUMENTS

| | | | |
|---|---|---|---|
| 2008/0181144 A1* | 7/2008 | Rofougaran | 370/297 |
| 2010/0053081 A1* | 3/2010 | Jee et al. | 345/157 |
| 2011/0037496 A1* | 2/2011 | Ibaraki et al. | 326/30 |
| 2012/0182938 A1* | 7/2012 | Mujtaba et al. | 370/328 |

OTHER PUBLICATIONS

National Instruments, "Proper Termination for High-Speed Digital I/O Applications," available online at www.ni.com, Sep. 6, 2006, pp. 1-3.

* cited by examiner

SEMICONDUCTOR INTEGRATED CIRCUIT DEVICE, ELECTRONIC DEVICE, AND RADIO COMMUNICATION DEVICE

CROSS-REFERENCE TO RELATED APPLICATIONS

This application is based upon and claims the benefit of priority from Japanese patent application No. 2011-121534, filed on May 31, 2011, the disclosure of which is incorporated herein in its entirety by reference.

BACKGROUND

The present application relates to a semiconductor integrated circuit device, and an electronic device and a radio communication device using it.

In recent years, electronic devices, such as mobile phone terminals, commonly support multimedia function. As a result, it is required to perform communication between a host processor (e.g., host integrated circuit (IC), or host device), which serves as a semiconductor integrated circuit device for controlling data processing, and a peripheral device (e.g., slave IC, peripheral IC, or peripheral device) such as a camera device and a display device. As an example of the technique for supporting data transfer inside a mobile phone terminal, M-PHY, which has been drawn up by Mobile Industry Processor Interface (MIPI) alliance, has been known. Further, as other data transfer techniques, Low Voltage Differential Signaling (LVDS), Point-to-Point mini-LVDS (PPmL), Advanced PPmL, Embedded Display Port (eDP), and the like have been known.

Japanese Unexamined Patent Application Publication Nos. 2002-297274 and 2009-130500 disclose a device including a transmission line.

SUMMARY

The inventors of the present application have found various problems arising in the development of peripheral devices (e.g., camera devices or display devices) and semiconductor integrated circuit devices that control those peripheral devices, used in radio communication devices and the like. Embodiments disclosed in the present application can provide a semiconductor integrated circuit device that can be suitably used for radio communication devices and the like, and high-quality electronic devices using the semiconductor integrated circuit device. Other detailed features will become obvious by referring to the following descriptions of this specification and the attached drawings.

In an aspect, a semiconductor integrated circuit device includes a variable-impedance circuit.

In another aspect, an electronic device includes a semiconductor integrated circuit including a variable-impedance circuit, and a module controlled by the semiconductor integrated circuit.

According to each of the above-described aspects, it is possible to provide a semiconductor integrated circuit device that can be suitably used for electronic devices, and a high-quality electronic device using the semiconductor integrated circuit device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Specific embodiments are explained hereinafter with reference to the drawings. The same signs are assigned to the same components throughout the drawings, and duplicate explanation is omitted as appropriate for clarifying the explanation.

First Embodiment

A radio communication device 500 according to this embodiment includes a host IC 10, and first and second peripheral devices 20 and 30 controlled by the host IC 10. Examples of the host IC 10 include a semiconductor integrated circuit device, a host processor, and an application processor. Examples of each of the peripheral devices 20 and 30 include a camera device and a display device. FIG. 1 shows external views showing a structural example of the radio communication device 500. Further, FIG. 2 is a functional block diagram showing a configuration example of the radio communication device 500. Note that FIGS. 1 and 2 show a configuration example where the radio communication device 500 is a folding-type mobile phone terminal. However, examples of the radio communication device 500 also include a smart phone, a portable game terminal, a tablet personal computer (PC), a laptop PC, and other radio communication devices. A configuration and functions of the radio communication device 500 are explained hereinafter with reference to FIGS. 1 and 2.

Figure 1A:
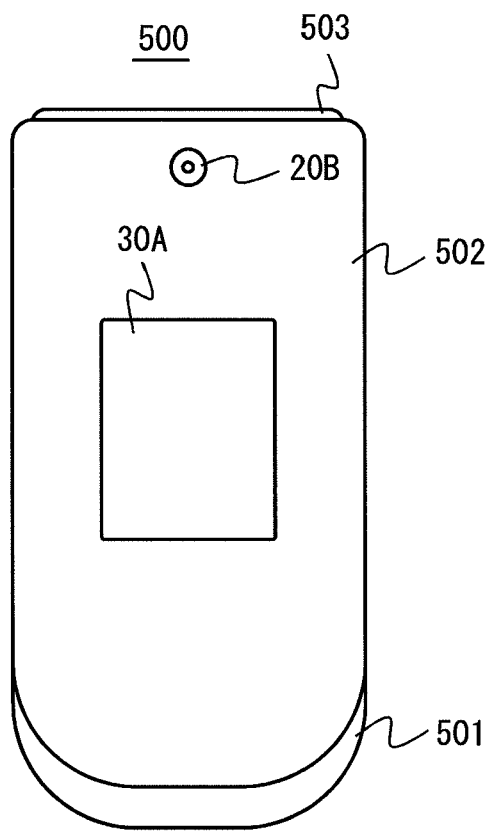
FIGS. 1A and 1B are external views showing a structural example of a radio communication device according to a first embodiment.
Figure 1B:
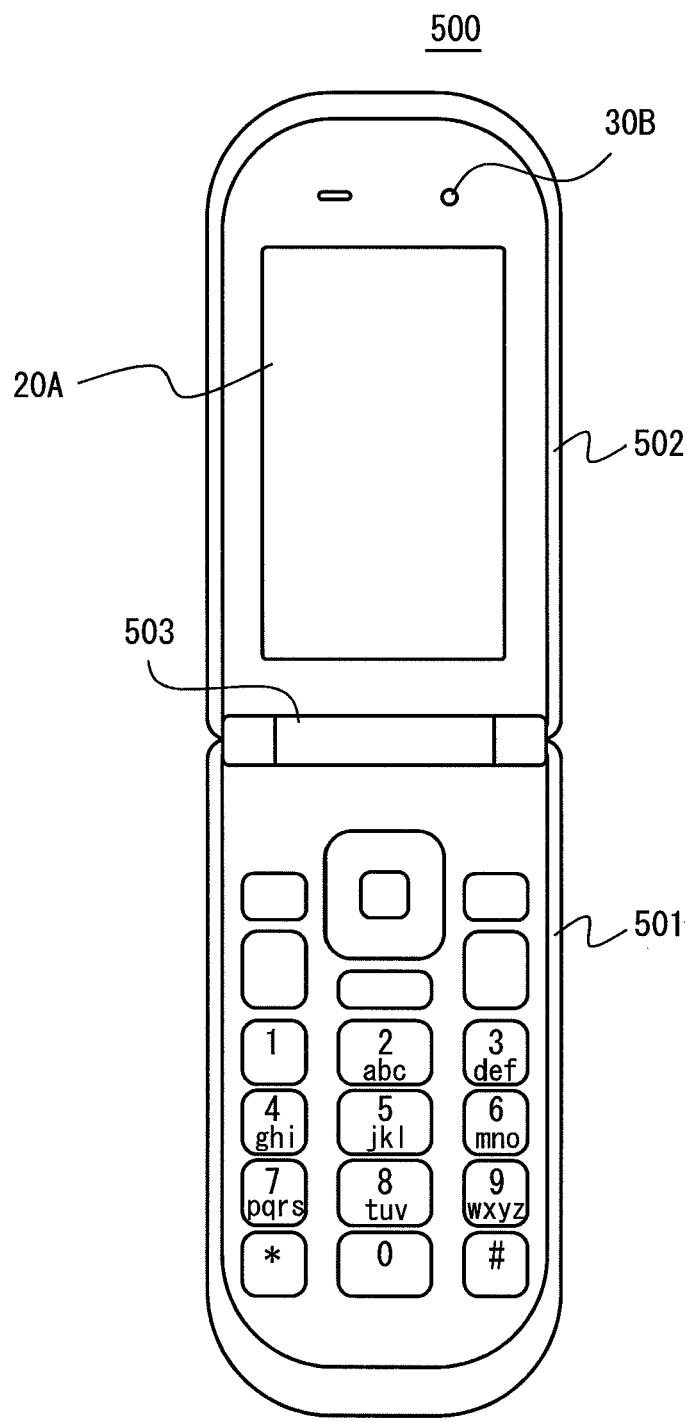
Figure 2:
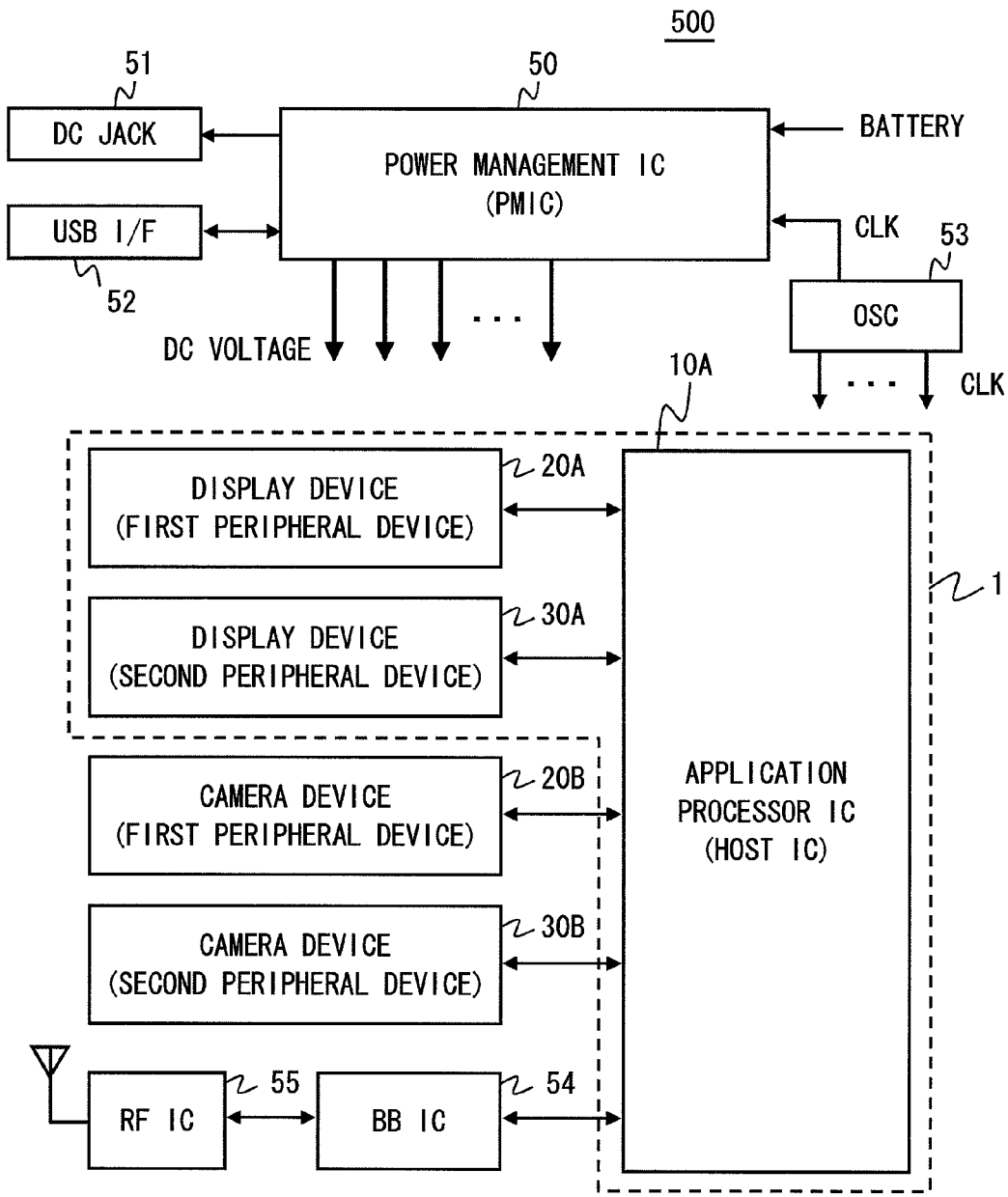
FIG. 2 is a block diagram showing a configuration example of a radio communication device according to the first embodiment.

FIG. 1A shows a closed state (i.e., folded state) of the radio communication device 500, which is a folding type mobile phone terminal. FIG. 1B shows an opened state of the radio communication device 500. The radio communication device 500 has a first housing 501 and a second housing 502 connected through a hinge 503. In the example shown in FIGS. 1A and 1B, operation buttons are arranged on the first housing 501. Meanwhile, the second housing 502 contains two display devices 20A and 30A, and two camera devices 20B and 30B. Each of the display devices 20A and 30A is a liquid crystal display (LED), an organic light-emitting diode (OLED) display, or the like. Note that the display device 20A and the camera device 20B are examples of a first peripheral device 20 (which is explained later). Further, the display device 30A and the camera device 30B are examples of a second peripheral device 30 which is explained later.

The display device 20A is disposed such that its display surface is positioned on the inside main surface (i.e., front surface) of the second housing 502. That is, the display device 20A is a main display that is viewed by a user when the user operates the device 500 in an opened state. On the other hand, the display device 30A is a sub display, and disposed such that its display surface is positioned on the outside main surface (i.e., rear surface) of the second housing 502.

The camera device 20B is a main camera, and disposed such that its lens unit is positioned on the outside main surface (rear surface) of the second housing 502. On the other hand, the camera device 20B is a sub camera, and disposed such that its lens unit is positioned on the inside main surface (front surface) of the second housing 502.

Next, an internal structure of the radio communication device 500 is explained with reference to FIG. 2. An application processor IC 10A is a micro processor, and performs multimedia processing by executing various application programs such as a WEB browser and a mailer. The application processor IC 10A is a specific example of a host IC 10 which is explained later.

The configuration example shown in FIG. 2 also includes a power management IC 50, an oscillator circuit 53, a baseband IC 54, a radio frequency IC (RF-IC) 55, and so on. The power management IC 50 manages a battery, and thereby provides a DC power supply voltage to various components including the application processor IC 10A and the display devices 20A and 30A. In order to reduce the power consumption, the power management IC 50 performs power supply management including stopping the power supply voltage to the various components according to the operating state of the radio communication device 500. Further, the power management IC 50 may output an audio signal to a DC jack 51, and provide an USB interface 52.

In the example shown in FIG. 2, the application processor IC 10A transfers image data signals to the display devices 20A and 30A. In this embodiment, in order to transfer this image data signal, the application processor IC 10A is connected to the display devices 20A and 30A through a Point-to-Multipoint (hereinafter referred to as "P-MP") connection. Note that the term "P-MP type" means (a) a data transmission form in which one driver is connected to plural receivers through a transmission line, (b) a data transmission form in which plural drivers are connected to one receiver through a transmission line, or (c) a data transmission form in which plural drivers are connected to plural receivers through a transmission line. In the example shown in FIG. 2, one application processor IC 10A (i.e., one driver) drives a transmission line to which two display devices 20A and 30A (i.e., two receivers) are connected.

In the following explanation, an electronic device (i.e., electronic module) 1 including the application processor IC 10A (i.e., the host IC 10) and the display devices 20A and 30A (i.e., the peripheral devices 20 and 30) is explained. In particular, P-MP type data transmission performed in the electronic device 1 is explained in detail.

Figure 3:
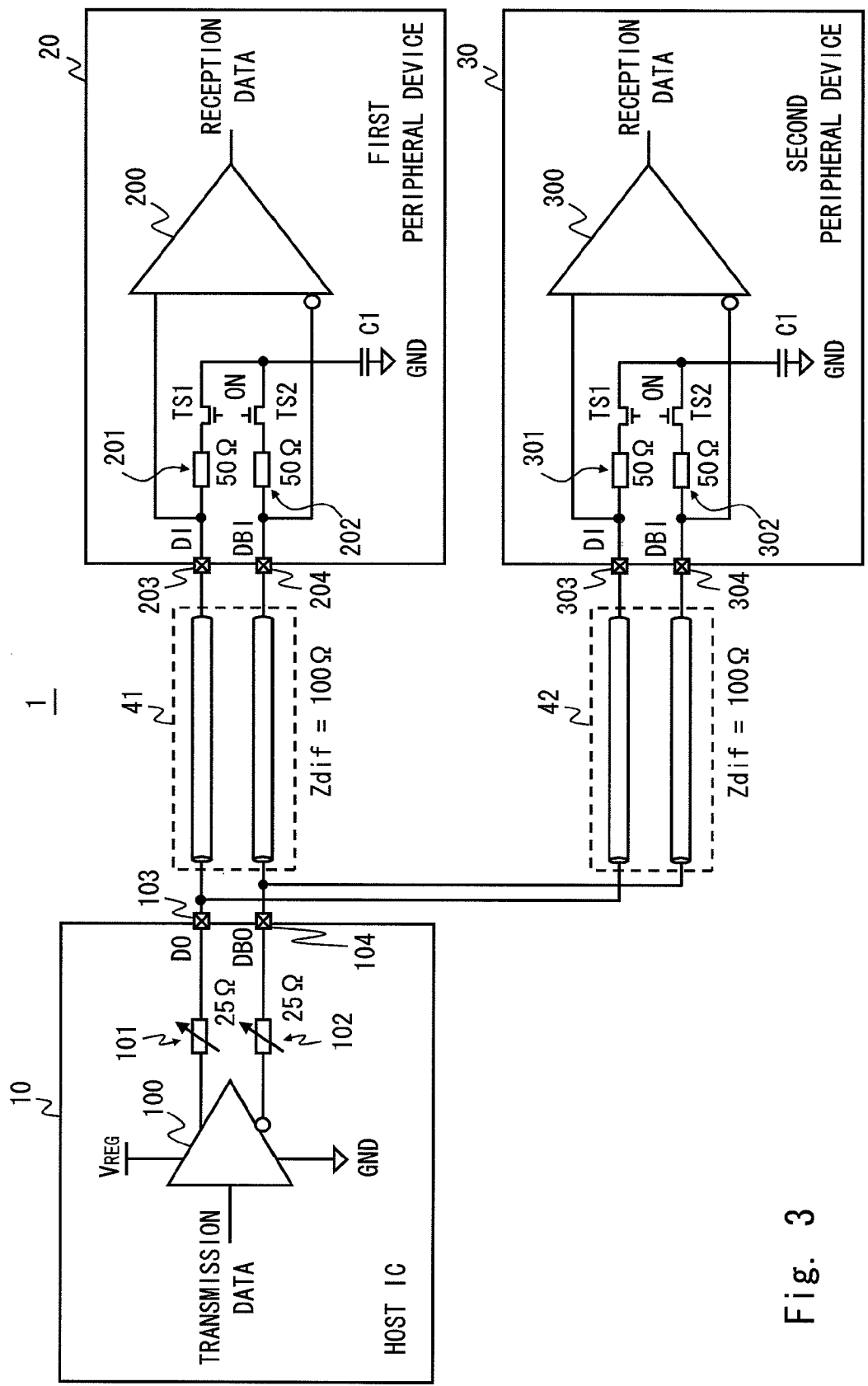
FIG. 3 is a block diagram showing a configuration example of an electronic device 1 shown in FIG. 2.

FIG. 3 is a block diagram showing a configuration example of the electronic device 1 according to this embodiment. The electronic device 1 shown in FIG. 3 has a P-MP type configuration in which one differential driver 100 drives differential transmission lines 41 and 42 connected to two differential receivers 200 and 300.

The host IC (e.g., semiconductor integrated circuit device, host processor, or application processor) 10 includes the differential driver 100. The differential driver 100 receives a transmission data signal (i.e., single-ended signal) as a pulse signal, generates a differential pulse signal from the data signal, and drives the differential transmission lines 41 and 42. The output of the differential driver 100 is provided to output terminals 103 and 104. In general, since the output impedance of the differential driver 100 is comparatively smaller than the differential impedance of the differential transmission lines 41 and 42, series termination is used to match the impedances and thereby to suppress the signal reflection. In the example shown in FIG. 3, series termination circuits 101 and 102 are coupled between the output terminals of the differential driver 100 and output terminals 103 and 104, and configured to series-terminate the differential transmission lines 41 and 42. Further, each of the series termination circuits 101 and 102 is formed as a variable-impedance circuit so that the impedance value of the series termination can be adjusted.

Figure 4:
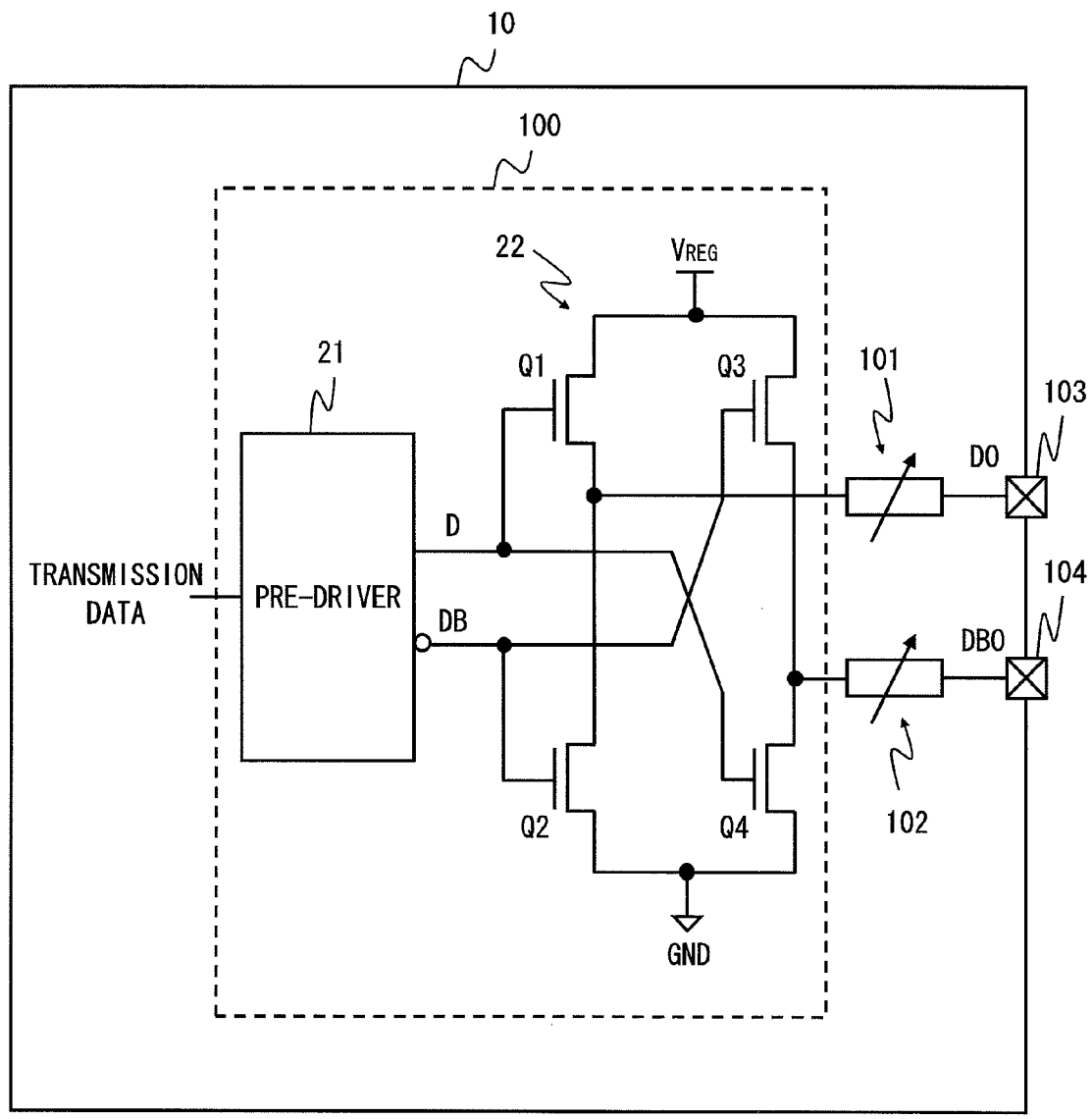
FIG. 4 shows a configuration example of a differential driver 100 shown in FIG. 3.

The differential driver 100 is configured, for example, as shown in FIG. 4. The differential driver 100 shown in FIG. 4 includes a pre-driver 21 that converts a single-ended signal into a differential signal, and a push-pull buffer 22 as an output stage. The push-pull buffer 22 includes a first push-pull section including n-channel metal-oxide-semiconductor (MOS) transistors Q1 and Q2, and a second push-pull section including n-channel MOS transistors Q3 and Q4. The gates of the transistors Q1 and Q3 are connected to an in-phase data line D. Meanwhile, the gates of the transistors Q2 and Q4 are connected to an opposite-phase data line DB. As a result, the first push-pull section generates an in-phase output DO and the second push-pull section generates an opposite-phase output DBO. Note that other circuit configurations may be also used for the differential driver 100 shown in FIG. 2.

Figure 5:
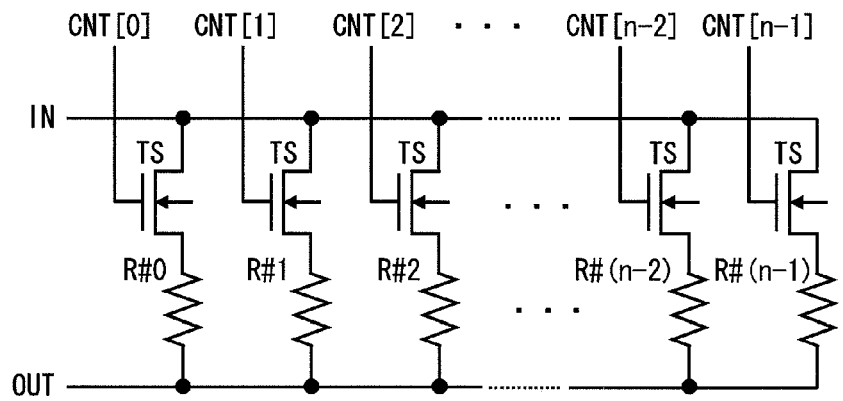
FIG. 5 shows a first configuration example of a series termination circuit 101 shown in FIG. 3.
Figure 6:
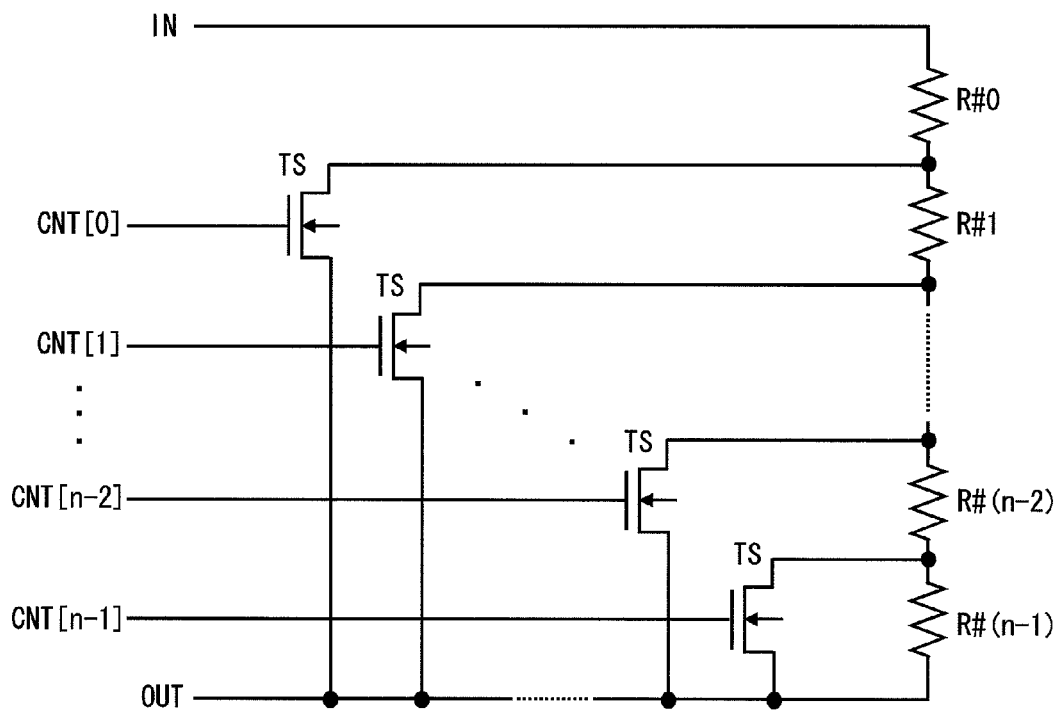
FIG. 6 shows a second configuration example of the series termination circuit 101 shown in FIG. 3.
Figure 7:
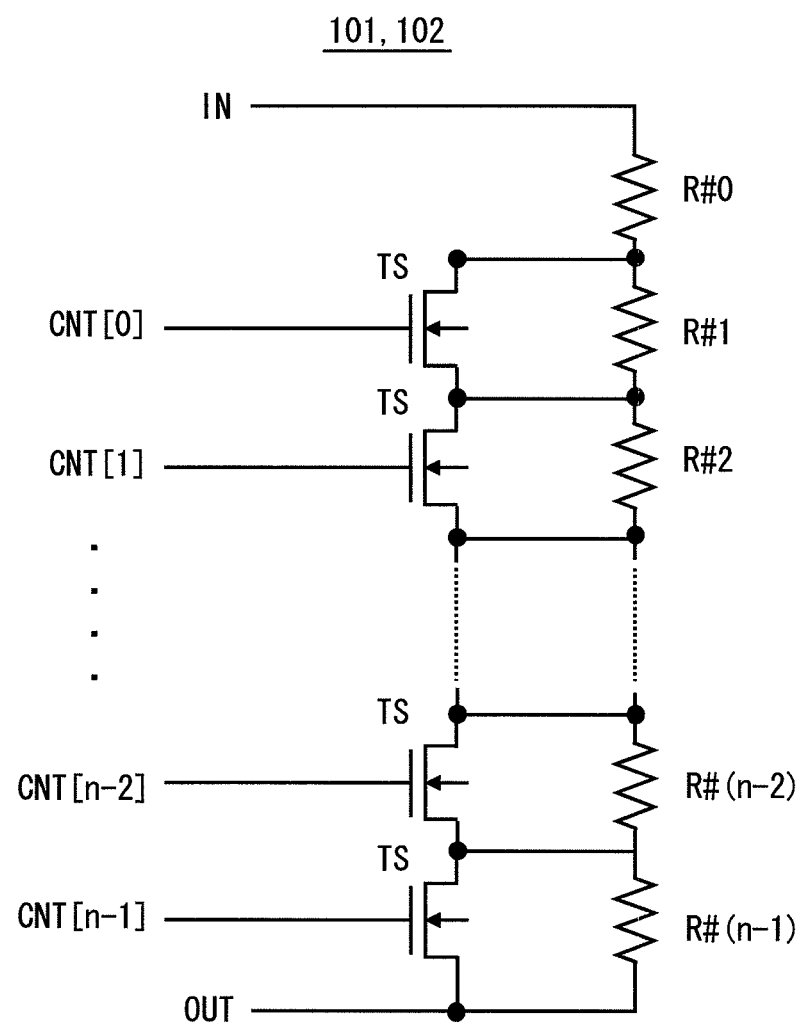
FIG. 7 shows a third configuration example of the series termination circuit 101 shown in FIG. 3.

Next, configuration examples of the series termination circuits 101 and 102 are shown in FIGS. 5 to 7. FIGS. 5 to 7 show configuration examples including variable-resistance circuits as specific examples of the variable-impedance circuit. In the configuration example shown in FIG. 5, the number of resistors that are connected in parallel between an input IN and an output OUT, among n resistors R#0 to R# (n−1), is changed according to On/Off states of n transistor switches TS. In the configuration examples shown in FIGS. 6 and 7, the number of resistors that are connected in series between an input IN and an output OUT, among n resistors R#0 to R# (n−1), is changed according to On/Off states of n transistor switches TS. In the configuration examples shown in FIGS. 5 to 7, the adjustment of the impedance value (i.e., resistance value in these examples) is performed, for example, according to a value CNT [0:n−1] of an n-bit register (not shown). In the case where the number of peripheral devices 20 and 30 driven by the host IC 10 does not change, the setting of this n-bit register may be performed at the time of the setup of the host IC 10 performed upon the power-on. In the case where the number of peripheral devices 20 and 30 dynamically changes, the n-bit register may be set in response to the change of the number of peripheral devices while the host IC 10 is operating. Note that other circuit configurations may be also used for the series termination circuits 101 and 102 shown in FIGS. 3 and 4.

The explanation is continued by referring to FIG. 3 again. The first peripheral device 20 includes a differential receiver 200. The differential receiver 200 receives a differential pulse signal transmitted from the differential driver 100 and generates a reception data signal (i.e., single-ended signal). The differential receiver 200 may be formed, for example, by a hysteresis comparator and a complementary MOS (CMOS) push-pull circuit. The hysteresis comparator receives a differential pulse signal and outputs a comparison result between the two signal voltages of the differential pulse signal. The CMOS push-pull circuit is an amplifier circuit that outputs the comparison result of the hysteresis comparator as a single-ended signal. Input terminals 203 and 204 are reception terminals for the differential pulse signal, and are connected to the differential transmission line 41 and input terminals of the differential receiver 200. In general, since the input impedance of the differential receiver 200 is comparatively larger, than the differential impedance of the differential transmission lines 41 and 42, parallel termination is used to match the impedances and thereby to suppress the signal reflection. Each of the parallel termination circuits 201 and 202 includes an impedance element (e.g., resistive element). The parallel termination circuits 201 and 202 are connected in parallel to two lines of the differential transmission line 41 through transistor switches TS1 and TS2. That is, the differential transmission line 41 is parallel-terminated by the impedance elements of the parallel termination circuits 201 and 202 and the on-resistances of the transistor switches TS1 and TS2. Note that in the example shown in FIG. 3, the impedance elements of the parallel termination circuits 201 and 202 are connected to a circuit ground through a bypass capacitor C1 in order to eliminate the common-mode noise.

The second peripheral device 30 includes a differential receiver 300. The second peripheral device 30 is connected to the differential transmission line 42 that is branched from the differential transmission line 41. The configuration of the second peripheral device 30 relating to the reception of a differential pulse signal is similar to that of the above-described first peripheral device 20. That is, input terminals 303 and 304 are reception terminals for the differential pulse signal. Parallel termination circuits 301 and 302 are connected in parallel to two lines of the differential transmission line 42 through the transistor switches TS1 and TS2. Further, the impedance elements of the parallel termination circuits 301 and 302 are connected to a circuit ground through a bypass capacitor C1.

In the example shown in FIG. 3, the differential transmission line 42 is branched from the differential transmission line 41 near the output terminals 103 and 104 of the host IC 10. Each of the differential transmission lines 41 and 42 are, for example, a twisted-pair line. Alternatively, the differential transmission lines 41 and 42 may be printed lines formed a rigid or flexible substrate, or may be small-gage coaxial cables.

Next, the adjustment of the series termination circuits 101 and 102, which are formed as variable-impedance circuits, is explained hereinafter. The impedance that is required at the output end of the differential driver 100 in an electronic device that performs Point-to-Point (hereinafter referred to as "P-P") type data transmission is different from that required in an electronic device that performs P-MP type data transmission. The term "P-P type" means a data transmission form in which one driver is connected to one receiver through a transmission line in a one-to-one configuration. Specifically, in the case of the P-MP type shown in FIG. 3, it is necessary to change the impedance value of the series termination provided at the output end of the differential driver 100 in comparison to the impedance value in the P-P type in which the differential driver 100 and the differential receiver are connected in a one-to-one configuration. The same is also true for the case of the P-MP type where the number of receivers connected to the differential transmission line is changed.

The host IC 10 according to this embodiment includes the series termination circuits 101 and 102, which are formed as variable-impedance circuits. Therefore, in this embodiment, the impedance value of the series termination circuits 101 and 102 can be changed depending on whether the host IC 10 is used for an electronic device that performs P-P type data transmission or for an electronic device that performs P-MP type data transmission, i.e., according to the number of receivers connected to the differential transmission line.

In the example shown in FIG. 3, the differential impedance Zdif of the differential transmission lines 41 and 42 and the impedance value of the parallel termination circuits 201, 202, 301 and 302 of the peripheral devices 20 and 30 are corresponds to those of the P-P type data transmission. That is, the differential impedance Zdif of each of the differential transmission lines 41 and 42 is 100Ω. Further, the impedance value of each of the parallel termination circuits 201, 202, 301 and 302 is 50Ω. That is, the combined impedance of the parallel termination circuits 201 and 202 is 100Ω. Similarly, the combined impedance of the parallel termination circuits 301 and 302 is 100Ω.

Meanwhile, the impedance value of the series termination of the host IC 10 shown in FIG. 3 needs to be different from that of the P-P type data transmission (i.e., from 50Ω). Specifically, the impedance value of each of the series termination circuits 101 and 102, which are formed as variable-impedance circuits, may be adjusted to 25Ω. In this manner, it is possible to achieve appropriate termination between the differential driver 100 and the differential transmission lines 41 and 42, and thereby to suppress the signal reflection. Further, by adjusting the impedance value of the series termination in this manner, it is possible to make the amplitude of the input differential voltage Vdif of each of the differential receivers 200 and 300 equal or close to that of the case of the P-P type (e.g., the case where the differential driver 100 and the differential receiver 200 are connected in a one-to-one configuration). Specifically, the amplitude of the input differential voltage Vdif becomes equal to the half of the amplitude of the output voltage of the differential driver 100 (i.e., V_REG×½).

As described above, in this embodiment, the series termination circuits 101 and 102 of the host IC 10 including the differential driver 100 are formed as variable-impedance circuits. As a result, it is possible to use the host IC 10 including series termination circuits for both an electronic device that performs P-P type data transmission and an electronic device that performs P-MP type data transmission. Therefore, in the configuration in which the host IC 10 is connected to peripheral devices including the peripheral devices 20 and 30, there is no need to arrange a bridge chip that is used to selectively connect between the host IC 10 and one of the peripheral devices. Further, there is no need to arrange plural differential drivers 100 for individually forming a P-P connection between the host IC 10 and each of the peripheral devices. Therefore, the host IC 10 according to this embodiment can contribute to the reduction of the chip size and the reduction of the circuit scale.

COMPARATIVE EXAMPLE

A comparative example in which the host IC 10 described above in this embodiment is not used is explained hereinafter.

Figure 8:
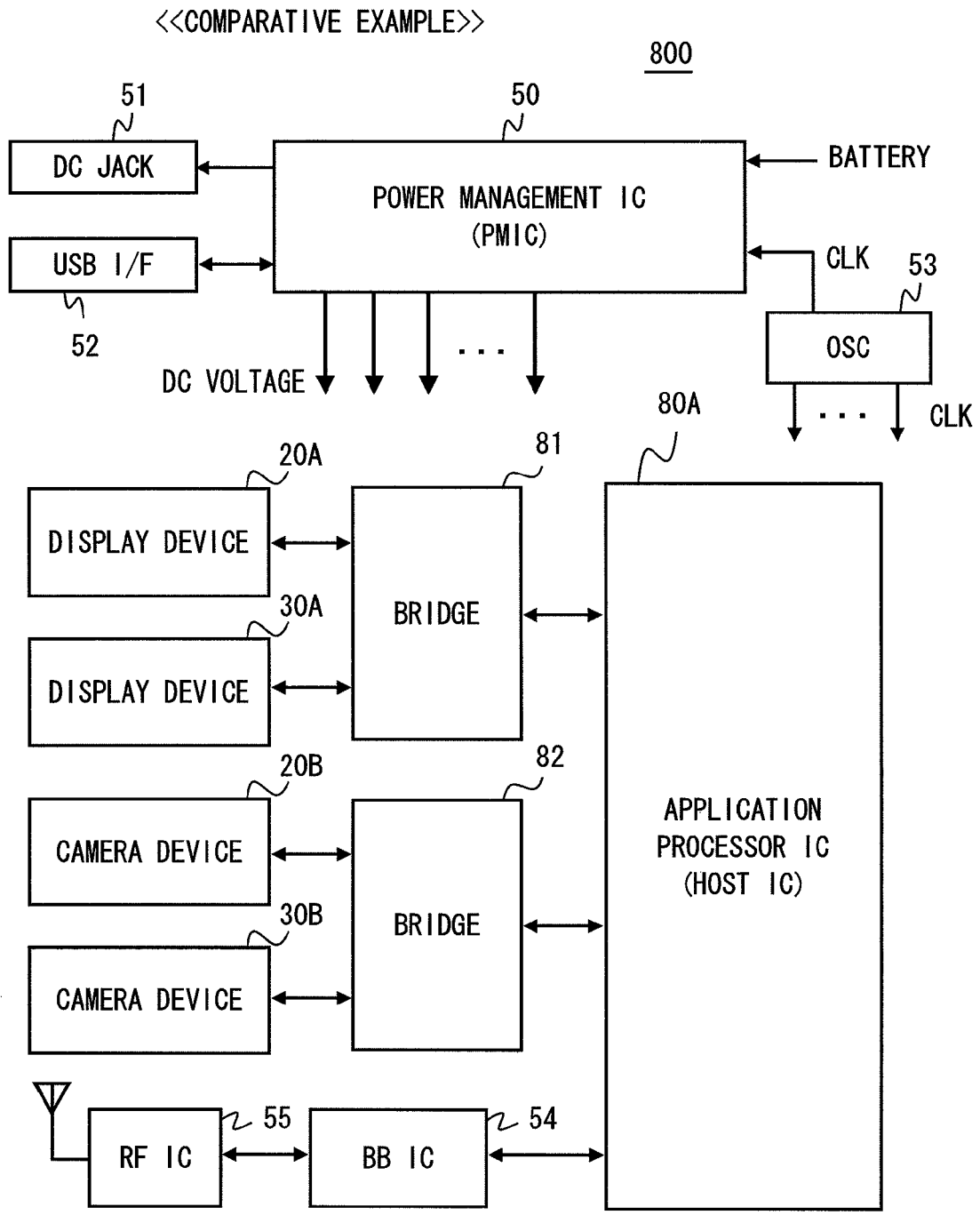
FIG. 8 is a block diagram showing a configuration of a radio communication device according to a comparative example.

FIG. 8 is a block diagram showing a configuration example of a radio communication device 800 according to a comparative example. In the example shown in FIG. 8, an application processor IC 80A (i.e., host IC) is connected to display devices 20A and 30A (i.e., first and second peripheral devices) through a bridge chip 81. The bridge chip 81 includes an analog switch, and thereby switches the device to be connected to the application processor IC 80A between the peripheral devices 20A and 20B. That is, by switching between transmission lines by using the bridge chip 81, the application processor IC 80A is P-P-connected to the peripheral device 20A or 20B. Similarly, the application processor IC 80A (i.e., host IC) is connected to camera devices 20B and 30B (i.e., first and second peripheral devices) through a bridge chip 82.

The comparative example shown in FIG. 8 makes it possible to form connections between one application processor IC 80A (i.e., host IC) and display devices 20A and 30A (i.e., first and second peripheral devices) without causing impedance mismatch even when the impedance value of the series termination of the application processor IC 80A (i.e., host IC) cannot be changed. However, since it is necessary to provide the bridge chip 81, there is a problem that the chip size and the circuit scale could become larger.

In contrast to this, as shown in FIG. 2, the first embodiment can connect one application processor IC 10A (i.e., host IC) to display devices 20A and 30A (i.e., first and second peripheral devices) without using any bridge chip. Therefore, the first embodiment can contribute to the reduction of the chip size and the reduction of the circuit scale in the configuration in which the host IC is connected to peripheral devices.

Further, assume a case where an application processor IC 80A (i.e., host IC) that cannot change the impedance value of the series termination is connected to display devices 20A and 30A (i.e., first and second peripheral devices) without interposing the bridge chip 81 therebetween. In this case, the signal waveform deteriorates due to the impedance mismatch. Therefore, there is a possibility that an output image of the display device or an image obtained by the camera device deteriorates. In contrast to this, the first embodiment can make it possible to achieve appropriate termination between the differential driver 100 and the differential transmission lines 41 and 42, and thereby to suppress the signal reflection as described above. Therefore, it is possible to prevent the deterioration in the signal waveform and thereby to avoid the deterioration in the display image of the display device and/or the image obtained by the camera device.

Further, in the first embodiment, by forming each of the series termination circuits 101 and 102 of the host IC 10 including the differential driver 100 as a variable-impedance circuit, the host IC 10 can cope with different impedance conditions, i.e., the impedance condition of the P-P type and that of the P-MP type. Therefore, there is another advantage that peripheral devices that are originally used for the P-P type can be used for the peripheral devices 20 and 30 without making any design change. This advantage is particularly effective when the electronic device 1 is installed in an electronic apparatus such as a radio communication device 500 as shown in FIG. 2. That is, by connecting one differential driver 100 included in the application processor IC 10A with two differential receivers 200 and 300 included in the display devices 20A and 20B, it is possible to implement an application that uses the plurality of display devices at the same time. Further, in this case, ordinary display devices having a P-P data transmission interface can be used for the display devices 20A and 20B.

Figure 9:
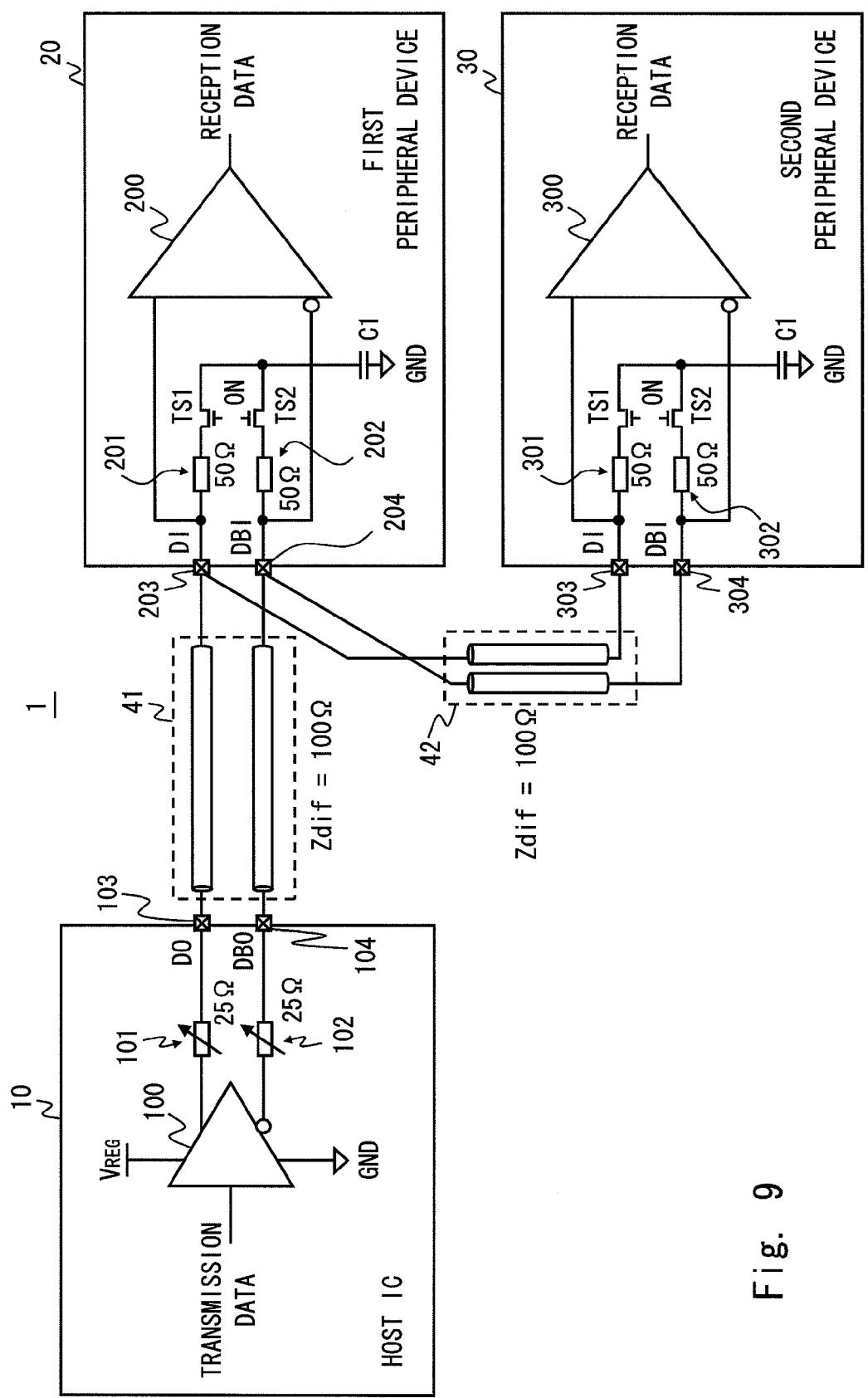
FIG. 9 is a block diagram showing another configuration example of the electronic device 1 shown in FIG. 2.

Note that in the configuration example shown in FIG. 3, the differential transmission line 42 is branched from the differential transmission line 41 near the output terminals 103 and 104 of the host IC 10. However, there is no particular restriction on the position of the branch point at which the differential transmission lines 41 and 42 are divided. For example, as shown in FIG. 9, the branch points may be positioned at the input terminals 203 and 204 of the first peripheral device 20.

Second Embodiment

In the above-described first embodiment, an example in which the series termination circuits 101 and 102 included in the host IC 10 are formed as variable-impedance circuits is explained. In this embodiment, a modified example in which parallel termination circuits included in the peripheral devices 20 and 30 are formed as variable-impedance circuits is explained.

Figure 10:
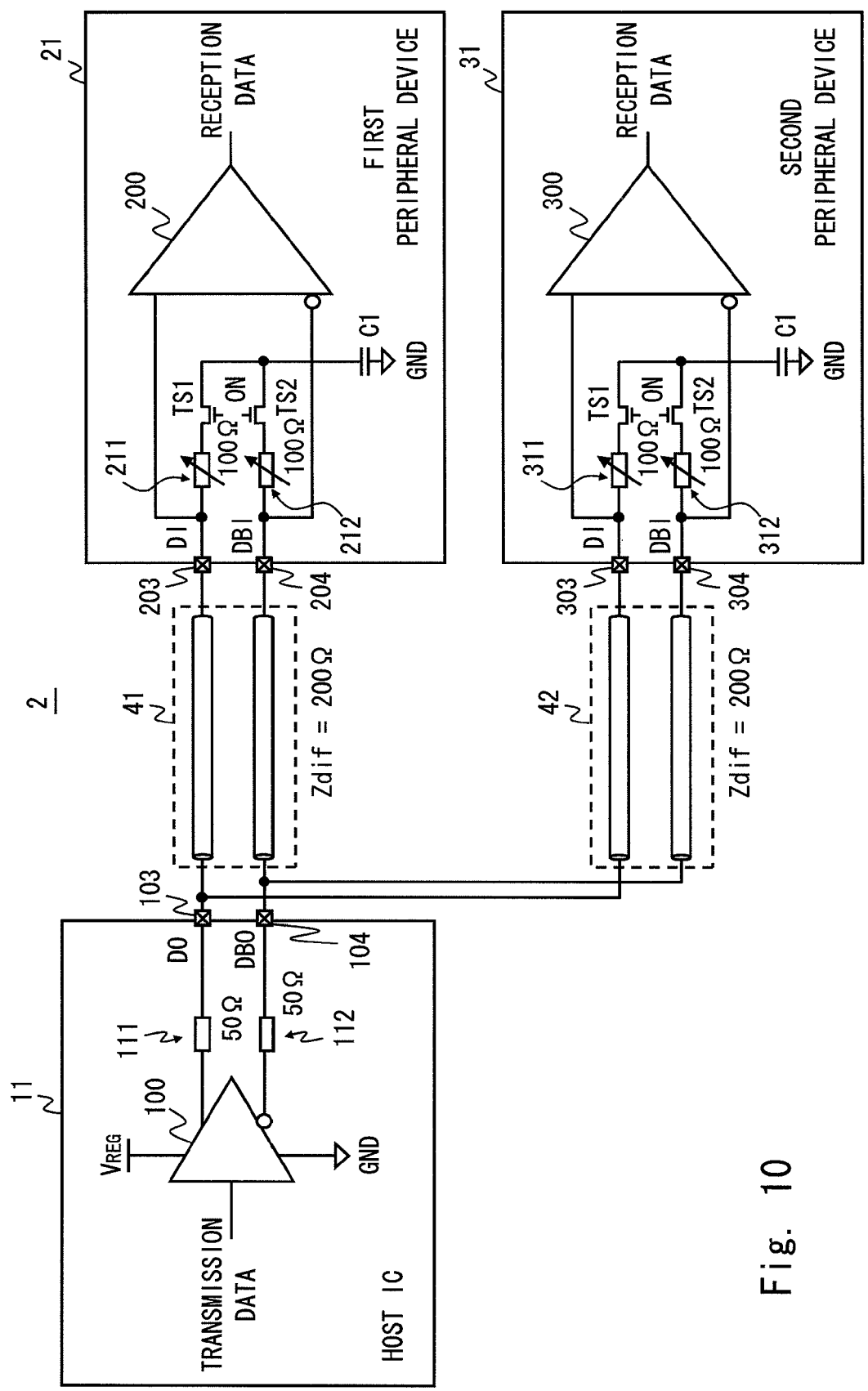
FIG. 10 is a block diagram showing a configuration example of an electronic device 2 according to a second embodiment.

FIG. 10 is a block diagram showing a configuration example of an electronic device 2 according to this embodiment. Similarly to the configuration example shown in FIG. 3, the electronic device 2 shown in FIG. 10 has a P-MP type configuration in which one differential driver 100 drives differential transmission lines 41 and 42 connected to two differential receivers 200 and 300. In the following explanation, each component included in the electronic device 2 is explained with a particular emphasis on the differences from the electronic device 1 explained above in the first embodiment.

A host IC 11 includes a differential driver 100. The differential driver 100 is similar to that described in the first embodiment. In the example shown in FIG. 10, series termination circuits 111 and 112 are coupled between the output terminals of the differential driver 100 and output terminals 103 and 104, and configured to series-terminate the differential transmission lines 41 and 42. The series termination circuits 111 and 112 are different from the circuits 101 and 102 shown in FIG. 3 in that the series termination circuits 111 and 112 are fixed-impedance elements rather than the variable-impedance circuits.

The peripheral devices 21 and 31 include differential receivers 200 and 300 respectively. The differential receivers 200 and 300 are similar to those described in the first embodiment. In the example shown in FIG. 10, each of the parallel termination circuits 211, 212, 311 and 312 is formed as a variable-impedance circuit so that the impedance value of the parallel termination can be adjusted.

Next, the adjustment of the parallel termination circuits 211, 212, 311 and 312, which are formed as variable-impedance circuits, is explained hereinafter. In this embodiment, the impedance value of the parallel termination circuits 211, 212, 311 and 312 may be changed depending on whether the peripheral devices 21 and 31 are used for a P-P transmission system or for a P-MP transmission system, i.e., according to the number of receivers connected to the differential transmission line.

In the example shown in FIG. 10, the impedance value of the series termination circuits 111 and 112 of the host IC 11 is equal or close to that of the P-P transmission system. That is, the impedance value of each of the series termination circuits 111 and 112 is 50Ω.

Meanwhile, the differential impedance Zdif of the differential transmission lines 41 and 42 and the impedance value of the parallel termination circuits 211, 212, 311 and 312 of the peripheral devices 21 and 31 in FIG. 10 need to be different from those of the case of the P-P type. Specifically, the differential impedance Zdif of the transmission lines 41 and 42 may be adjusted to 200Ω in order to match with the impedance value of the series termination (50Ω). Further, the impedance value of each of the parallel termination circuits 211, 212, 311 and 312, which are formed as variable-impedance circuits, may be adjusted to 100Ω. That is, the combined impedance value of the parallel termination circuits 211 and 212 is 200Ω. Similarly, the combined impedance value of the parallel termination circuits 311 and 312 is 200Ω.

As described above, in this embodiment, the parallel termination circuits 211 and 212 (311 and 312) of the peripheral device 21 (31) including the differential receiver 200 (300) are formed as variable-impedance circuits. As a result, it is possible to use the peripheral device 21 (31) including parallel termination circuits for both the P-P type transmission and the P-MP type transmission. Therefore, there is no need to arrange any bridge chip that is used to selectively connect between the host IC 11 and one of peripheral devices including the peripheral devices 21 and 31. Further, there is no need to arrange differential drivers 100 for individually forming a P-P connection between the host IC 11 and each of the peripheral devices. Therefore, the peripheral device 21 (31) according to this embodiment can contribute to the reduction of the chip size and the reduction of the circuit scale.

Further, since the peripheral device 21 (31) according to this embodiment can change the impedance value of the parallel termination depending on whether the transmission form is a P-P type or a P-MP type, the deterioration in the signal quality (e.g., deterioration in the display image of the display device) due to the impedance mismatch is suppressed. Further, in this embodiment, by forming each of the parallel termination circuits 211 and 212 (311 and 312) of the peripheral device 21 (31) including the differential receiver 200 (300) as a variable-impedance circuit, the peripheral devices 20 and 30 can cope with different impedance conditions i.e., the impedance condition of the P-P type and that of the P-MP type. Therefore, there is another advantage that ICs that are originally used for the P-P type can be easily used for the host IC 11 without making any design change.

Note that similarly to the first embodiment, there is no particular restriction on the position of the branch point of the differential transmission lines 41 and 42 in this embodiment. For example, similarly to the configuration shown in FIG. 9, the branch points may be positioned at the input terminals 203 and 204 of the first peripheral device 21 in this embodiment.

Third Embodiment

Figure 11:
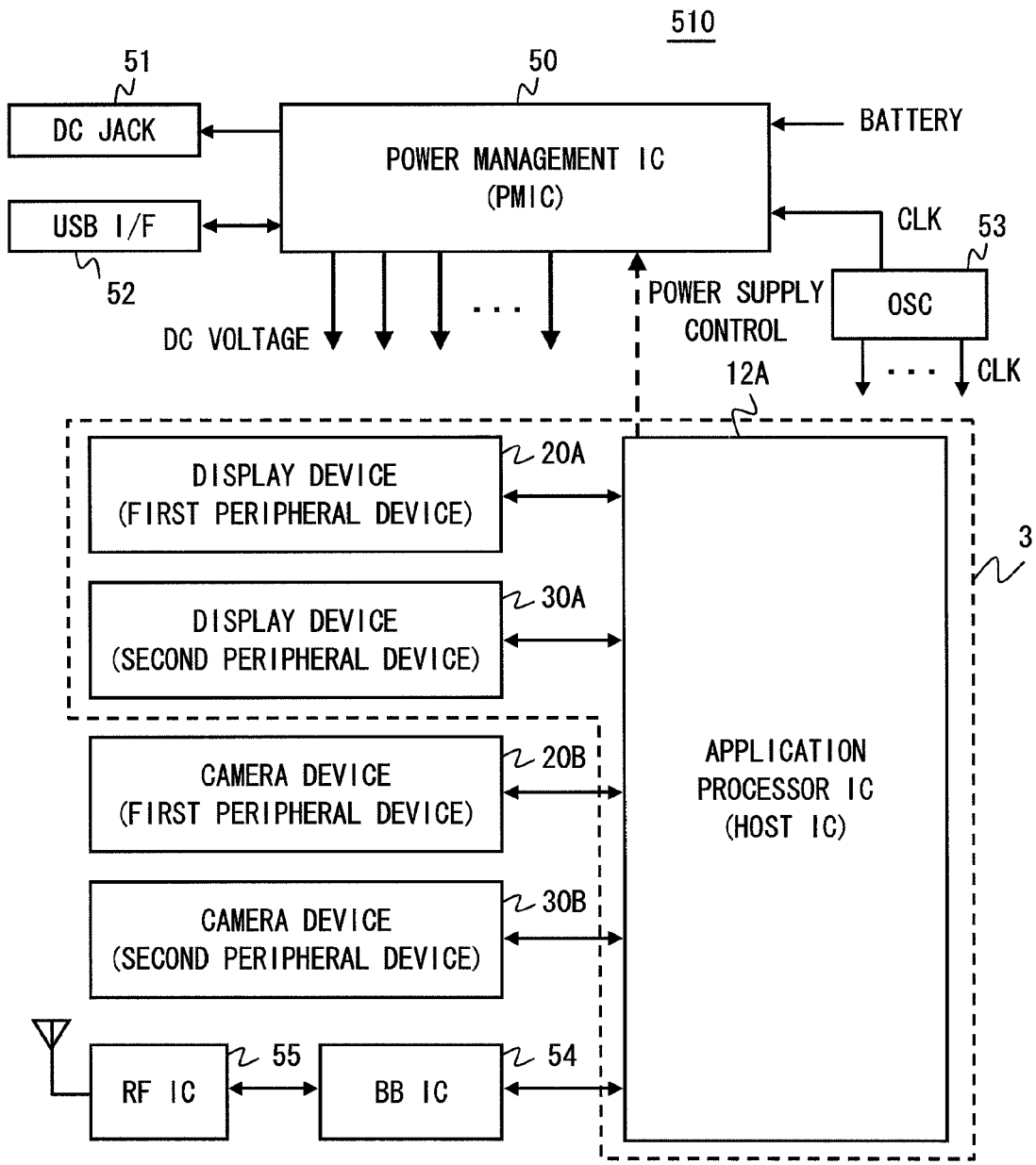
FIG. 11 is a block diagram showing a configuration example of a radio communication device according to a third embodiment.

A modified example of the above-described first embodiment is explained in this embodiment. FIG. 11 is a block diagram showing a configuration example of a radio communication device 510 according to this embodiment. Examples of the radio communication device 510 include a mobile phone terminal, a smart phone, a portable game terminal, a tablet PC, and a laptop PC. The radio communication device 510 includes an application processor IC 12A. The application processor IC 12A is a specific example of a host IC 12 (which is explained later). The application processor IC 12A transmits, to a power management IC 50, a control signal that is used to stop the power supply to a display device 30B. Then, the application processor IC 12A dynamically adjusts the impedance value of the series termination circuits 101 and 102 in order to cope with the change of the termination state of the transmission line 42 on the display device 30B side that is caused by the stop of the power supply to the display device 30B.

In the following explanation, an electronic device (i.e., electronic module) 3 including the application processor IC 12A (i.e., host IC 12) and the display devices 20A and 30A (i.e., peripheral devices 20 and 30) is explained. In particular, digital data transmission performed in the electronic device 3 is explained in detail.

Figure 12:
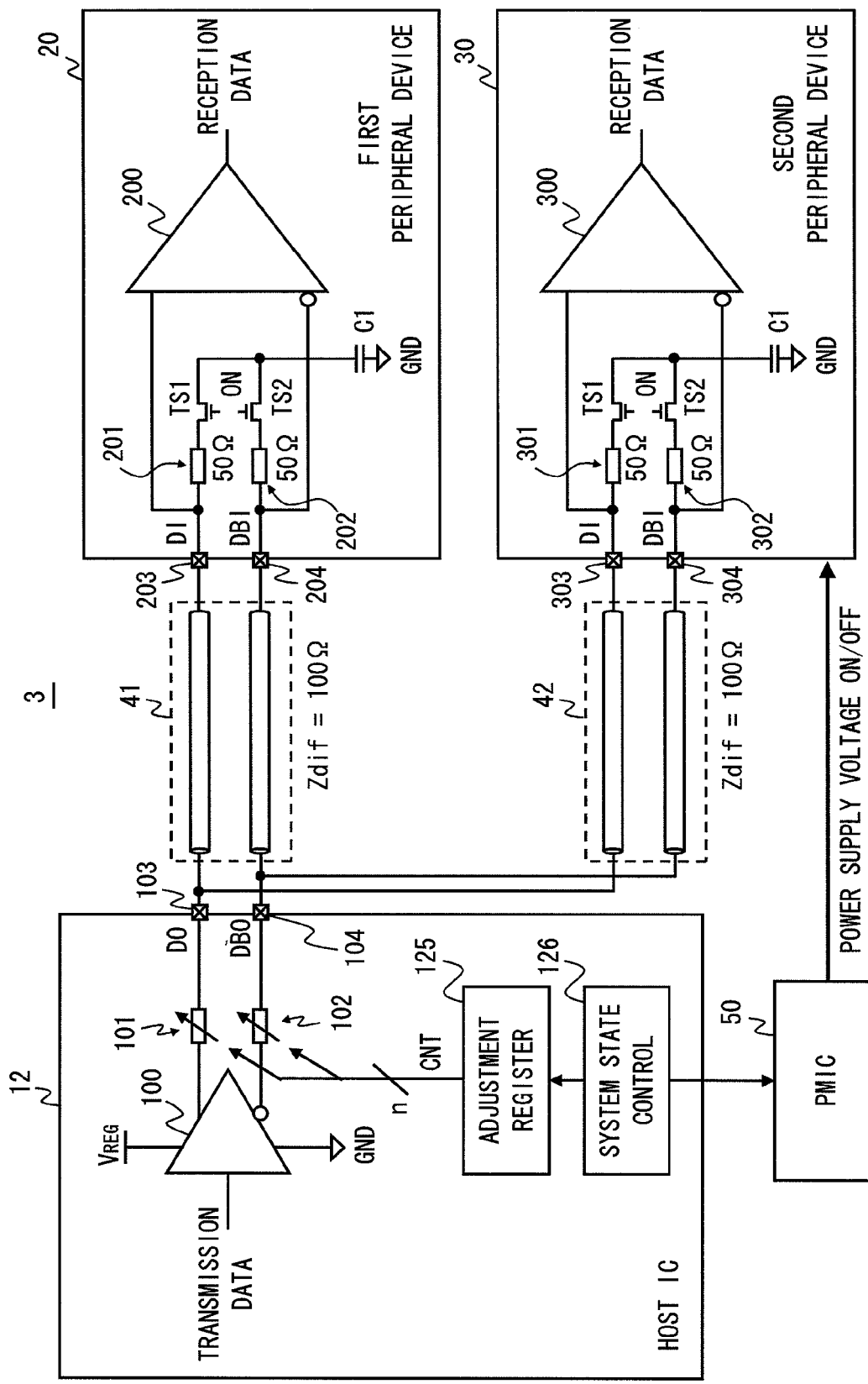
FIG. 12 is a block diagram showing a configuration example of an electronic device 3 shown in FIG. 11.

FIG. 12 is a block diagram showing a configuration example of the electronic device 3 according to this embodiment. In order to cope with the situation in which the parallel termination of the transmission line 42 by the parallel termination circuits 301 and 302 disposed at the input end of the differential receiver 300 is opened as a result of the operation stop of the differential receiver 300, the electronic device 3 adjusts the impedance value of the series termination circuits 101 and 102 (i.e., variable-impedance circuits) on the driver 100 side in response to the opening of the parallel termination.

The peripheral devices 20 and 30 shown in FIG. 12 are similar to those described in the first embodiment. However, the second peripheral device 30 is configured so that the start and stop of the operation of the second peripheral device 30 can be externally controlled. For example, as shown in FIG. 12, the second peripheral device 30 may be configured to stop its operation in response to the stop of the supply of the power supply voltage from the power management IC 50.

When the supply of the power supply voltage to the peripheral device 30 is stopped, the differential receiver 300 changes to a stopped state. In the stop state, it is desirable that input impedance of the differential receiver 300 becomes sufficiently higher than the impedance of the differential transmission line 42. Further, when the supply of the power supply voltage to the peripheral device 30 is stopped, the transistor switches TS1 and TS2 become an OFF state and the parallel termination of the differential transmission line 42 changes to an opened state (disable state).

The host IC 12 includes a differential driver 100 and series termination circuits 101 and 102. These features are similar to those described in the first embodiment. An adjustment register 125 holds a set value for the series termination circuits 101 and 102 as variable-impedance circuits. The value of the adjustment register 125 determines the impedance values of the series termination circuits 101 and 102. For example, when one of the example configurations shown in FIGS. 5 to 7 is used, the adjustment register 125 may hold an n-bit value CNT[0:n−1].

A system state control unit 126 controls the stop of the operation of the second peripheral device 30 and the adjustment of the impedance value of the series termination circuits 101 and 102. Specifically, when the system state control unit 126 starts the operation of the second peripheral device 30, the system state control unit 126 adjusts the series termination circuits 101 and 102 so that the impedance of the output end of the differential driver 100 matches the impedance of the differential transmission lines 41 and 42 for the one-to-two P-MP type data transmission. On the other hand, when the system state control unit 126 stops the operation of the second peripheral device 30, the system state control unit 126 adjusts the series termination circuits 101 and 102 so that the impedance of the output end of the differential driver 100 matches the impedance of the differential transmission lines 41 and 42 for the P-P type data transmission.

The system state control unit 126 may adjust the series termination circuits 101 and 102 by changing the value of the above-described register 125. Further, the system state control unit 126 may stop and start the operation of the second peripheral device 30 by sending, to the power management IC 50, a control signal instructing the stop or start of the power supply voltage to the peripheral device 30.

Figure 13:
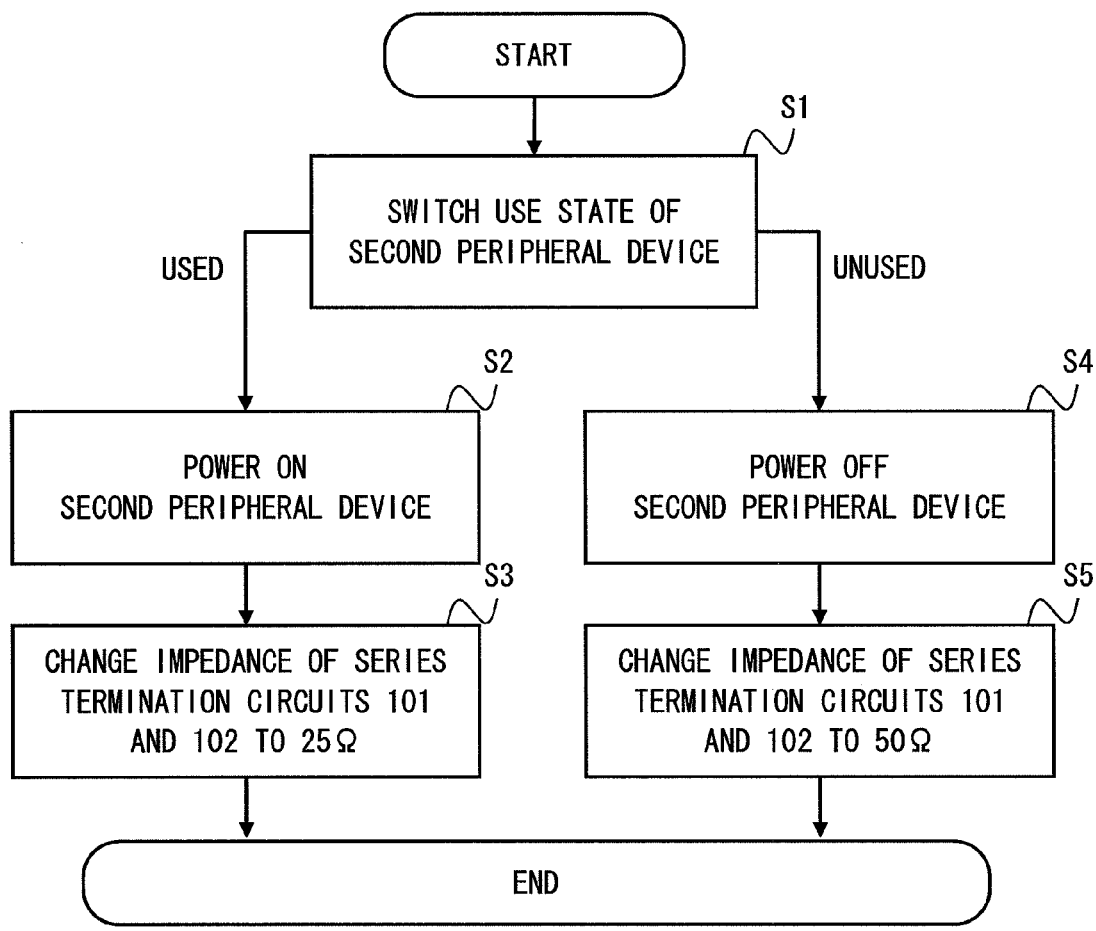
FIG. 13 is a flowchart showing a specific example of a control procedure performed by a system state control unit 126.

FIG. 13 is a flowchart showing a specific example of a control procedure performed by the system state control unit 126. In a step S1, the system state control unit 126 determines the switching of the use state of the second peripheral device 30. The switching of the use state of the second peripheral device 30 may be carried out in response to the switching of the operating mode (e.g., switching between an active mode and a standby mode) of the electronic device such as a radio communication device, or the switching of the application program to be executed in the electronic device.

When the second peripheral device 30 becomes a used state, the system state control unit 126 sends to the power management IC a control signal instructing to start the supply of the power supply voltage in order to power on the second peripheral device 30 (step S2). In a step S3, the system state control unit 126 adjusts the series termination circuits 101 and 102 so that the impedance value of the series termination circuits 101 and 102 becomes a value corresponding to the one-to-two P-MP type data transmission. In the example shown in FIG. 12, the impedance value of each of the series termination circuits 101 and 102 may be adjusted to 25Ω as explained above in detail in the first embodiment.

On the other hand, when the second peripheral device 30 becomes an unused state, the system state control unit 126 sends to the power management IC a control signal instructing to stop the supply of the power supply voltage in order to power off the second peripheral device 30 (step S4). In a step S5, the system state control unit 126 adjust the series termination circuits 101 and 102 so that the impedance value of the series termination circuits 101 and 102 becomes a value corresponding to the P-P type data transmission. In the example shown in FIG. 12, the impedance value of each of the series termination circuits 101 and 102 may be adjusted to 50Ω.

Note that the order of the steps S2 and S3 shown in FIG. 13 is a mere example. That is, the step S3 may be performed before the step S3, or the steps S2 and S3 may be performed in parallel. This is also true for the order of the steps S4 and S5.

The control performed by the system state control unit 126 shown in FIG. 13 may be implemented by using hardware logic circuits. Further, this control may be implemented by causing a computer, such as a microprocessor or a central processing unit (CPU), to execute a program. Specifically, the control may be implemented by creating a program including instructions for causing a computer to execute the algorithm shown in FIG. 13 and supplying this program to the computer.

This program can be stored in various types of non-transitory computer readable media and thereby supplied to computers. The non-transitory computer readable media includes various types of tangible storage media. Examples of the non-transitory computer readable media include a magnetic recording medium (such as a flexible disk, a magnetic tape, and a hard disk drive), a magneto-optic recording medium (such as a magneto-optic disk), a Compact disc read only memory (CD-ROM), a CD-R, and a CD-R/W, and a semiconductor memory (such as a mask ROM, a programmable ROM (PROM), an erasable PROM (EPROM), a flash ROM, and a random access memory (RAM)). Further, the program can be supplied to computers by using various types of transitory computer readable media. Examples of the transitory computer readable media include an electrical signal, an optical signal, and an electromagnetic wave. The transitory computer readable media can be used to supply programs to computer through a wire communication path such as an electrical wire and an optical fiber, or wireless communication path.

Electronic devices such as radio communication devices may change the number of peripheral devices (e.g., displays) according to the operating mode or according to the application program to be executed. The electronic device 3 according to this embodiment is particularly effective when it is applied to such electronic devices. It is conceivable that when the peripheral device 30 is not used, the power supply voltage is selectively supplied only to the circuits necessary for maintaining the parallel termination in the termination state (enable state) (i.e., parallel termination circuits 301 and 302, and transistor switches TS1 and TS2) and the power supply voltage to the other part including the differential receiver 300 is stopped. By doing so, signal reflection which would be otherwise caused by the open-stub state of the differential transmission line 42 connected to the unused peripheral device 30 never occurs. However, in order to operate the peripheral device 30 in this manner, it is necessary to modify the peripheral device 30 so that the operation of the differential receiver 300 is stopped and only the circuits relating to the parallel termination are maintained in the ON state.

In contrast to this, in this embodiment, the impedance value of the series termination circuits 101 and 102 on the differential driver 100 side is dynamically adjusted in response to the change of the parallel termination state of the differential transmission line 42 between a termination state (enable state) and an opened state (disable state) depending on the change of the operation state of the differential receiver 300. As a result, in this embodiment, it is possible, when the termination state of the differential transmission line 42 is changed as a result of the dynamic change of the operation state of the differential receiver 300 (i.e., peripheral device 30), to suppress the fluctuations in the input differential voltage Vdif of the differential receiver 200 which continues its operation, and to maintain the impedance match of the system and thereby to suppress the reflection signal. That is, when the electronic device 3 according to this embodiment is used, it is possible to power off the unused peripheral device 30 entirely including the circuits relating to the parallel termination. Therefore, it is unnecessary to modify the peripheral device 30 such that the operation of the differential receiver 300 is stopped and only the circuits relating to the parallel termination are maintained in the ON state.

Note that in the configuration example shown in FIG. 12, the differential transmission line 42 is branched from the differential transmission line 41 near the output terminals 103 and 104 of the host IC 10. However, similarly to the configuration shown in FIG. 9, the branch points may be positioned at the input terminals 203 and 204 of the first peripheral device 20 in this embodiment. In this embodiment, when the operation of the second peripheral device 30 is stopped, the parallel termination of the differential transmission line 42 is opened. That is, the differential transmission line 42 becomes an open-stub. Therefore, it is desirable that the differential transmission line 42 is as short as possible. When both the peripheral devices 20 and 30 are located physically far away from the host IC 12 and the physical distance between the peripheral devices 20 and 30 is relatively short, the wiring configuration like the one shown in FIG. 9 may be preferably used because the length of the differential transmission line 42 can be reduced by adopting such configuration.

Other Embodiments

The above-described first to third embodiments can be combined as appropriate.

In the above-described first to third embodiments, the one-to-two P-MP configuration is explained in a concrete manner.

However, the first to third embodiments can be also easily applied to one-to-three (or more) P-MP configurations. That is, the impedance value of the series termination circuits 101 and 102 or the parallel termination circuits 211, 212, 311 and 312, which are formed as variable-impedance circuits, may be adjusted to conform to the one-to-three (or more) P-MP configuration. Specifically, the variable-impedance circuits may be adjusted based on the combined impedance value of the parallel impedance elements on the receiver side that are arranged in parallel as viewed from the transmission line so that the impedances are matched.

Further, in the above-described first to third embodiments, a multi-drop configuration in which one driver is connected to plural receivers is explained in a concrete manner. However, the first to third embodiments can be also easily applied to configurations other than the multi-drop configuration. For example, the first to third embodiments may be applied to a configuration in which plural drivers are connected to one receiver. Further, the first to third embodiments may be applied to a configuration in which bi-directional and half-duplex transmission is performed.

Further, in the above-described first to third embodiments, examples in which one differential transmission line (lane) is connected between the host IC and the peripheral device is explained in a concrete manner. However, the first to third embodiments can be also easily applied to a configuration in which the host IC and the peripheral device are connected in parallel by using plural lanes. That is, combinations of drivers and receivers may be disposed in the host IC and the peripheral device according to the number of lanes.

Further, in the above-described first to third embodiments, examples in which the differential driver and the series termination circuits are integrated within one IC are explained. However, the first to third embodiments can be also easily applied to a configuration in which the series termination circuits are disposed outside the IC including the differential driver.

Further, in the above-described first to third embodiments, examples in which the differential receiver and the parallel termination circuits are integrated within one IC are explained. However, the first to third embodiments can be also easily applied to a configuration in which the parallel termination circuits are disposed outside the IC including the differential receiver.

Further, in the above-described first to third embodiments, the electronic device that performs differential data transmission is explained in a concrete manner. However, the first to third embodiments can be also easily applied to electronic devices that perform single-ended data transmission.

Further, the above-described first to third embodiments are explained by using a mobile phone terminal as a main example. However, the first to third embodiments can be also applied to smart phones, portable game terminals, tablet PCs, laptop PCs, and other radio communication devices. Further, they can be also applied to other electronic devices that do not have any radio communication function.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A radio communication device, comprising:
a radio frequency IC for processing radio frequency signals; a baseband IC for processing baseband signals, coupled to the radio frequency IC; an application processor IC including a driver circuit and a system state control unit, coupled to the baseband IC; a first peripheral device coupled to the driver circuit via a first transmission line and controlled by the driver circuit; a second peripheral device coupled to the driver circuit via a second transmission line and controlled by the driver circuit; and a power management IC controlled by the system state control unit and configured to control a power supply to the first and second peripheral devices, wherein the driver circuit and the first transmission line are coupled via a variable-impedance circuit, wherein the driver circuit and the second transmission line are coupled via the variable-impedance circuit, wherein the system state control unit is configured to adjust an impedance value of the variable-impedance circuit depending on a state of the power supply to the first and second peripheral devices, and wherein a series termination circuit of the first and second peripheral devices has a resistance of 50 ohms.

2. The semiconductor device according to claim 1,
wherein the variable-impedance circuit is configured to match impedances between the driver circuit and the first and second peripheral devices.

3. The semiconductor device according to claim 1,
wherein the first and second peripheral devices are camera devices.

4. A radio communication device, comprising:
a radio frequency IC for processing radio frequency signals; a baseband IC for processing baseband signals, coupled to the radio frequency IC; an application processor IC including a driver circuit and a system state control unit, coupled to the baseband IC; a first peripheral device coupled to the driver circuit via a first transmission line and controlled by the driver circuit; and a second peripheral device coupled to the driver circuit via a second transmission line and controlled by the driver circuit; and a power management IC controlled by the system state control unit and configured to control a power supply to the first and second peripheral devices, wherein the first peripheral device and the first transmission line are coupled via a first variable-impedance circuit, wherein the second peripheral device and the second transmission line are coupled via a second variable-impedance circuit,
wherein the system state control unit is configured to adjust impedance values of the first and second variable-impedance circuits depending on a state of the power supply to the first and second peripheral devices, and wherein a series termination circuit of the first and second peripheral devices has a resistance of 50 ohms.

5. The semiconductor device according to claim 4,
wherein the first variable-impedance circuit is configured to match an impedance between the driver circuit and the first peripheral device, and
wherein the second variable-impedance circuit is configured to match an impedance between the driver circuit and the second peripheral device.

6. The semiconductor device according to claim 4,
wherein the first and second peripheral devices are camera devices.

* * * * *